United States Patent
Bender et al.

(10) Patent No.: US 6,618,685 B1
(45) Date of Patent: Sep. 9, 2003

(54) NON-INVASIVE TESTING OF SMART CARDS

(75) Inventors: Michael S. Bender, Bolder Creek, CA (US); Shivaputtrappa Vibhuti, Dublin (IE); Paul Klissner, San Mateo, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/691,479

(22) Filed: Oct. 17, 2000

(51) Int. Cl.[7] .............................................. G01R 31/00
(52) U.S. Cl. ...................... 702/119; 702/12; 713/186; 340/825.33
(58) Field of Search ................ 702/119, 123; 382/115; 713/186, 182, 161; 340/825.33; 705/50, 71

(56) References Cited

U.S. PATENT DOCUMENTS

| | | | |
|---|---|---|---|
| 4,578,530 A | * 3/1986 | Zeidler | 705/71 |
| 5,533,123 A | * 7/1996 | Force et al. | 713/189 |
| 6,185,316 B1 | * 2/2001 | Buffam | 382/115 |
| 6,308,270 B1 | * 10/2001 | Guthery | 713/200 |

* cited by examiner

Primary Examiner—Bryan Bui
Assistant Examiner—Hien Vo
(74) Attorney, Agent, or Firm—O'Melveny & Myers LLP (57) ABSTRACT

A system and method is provided for non-invasive testing of smart cards. In a preferred embodiment, a host computer is connected to a controller, which is then connected, through a switch, to at least one computing device and at least one testing device. The testing device further includes a card terminal and a probe. Each probe includes a motor that is coupled to a cylindrical tube. The motor-tube configuration is used to actuate a card detect sensor in the card terminal. In response to a command provided by the host computer, the controller initiates a particular test. In one test, for example, the motor-tube configuration is used to simulate repeated insertions and removals of smart cards.

20 Claims, 9 Drawing Sheets

NON-INVASIVE TESTING OF SMART CARDS

BACKGROUND OF THE INVENTION

1. Field of the Invention

The present invention relates to the testing of systems that use smart cards.

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

Sun, Sun Microsystems, the Sun logo, Solaris and all Java-based trademarks and logos are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

2. Background Art

In modern computing it is desirable for a user to be interacting with a computer, to stop the interacting with the computer, to move to a new computer, and to begin interacting with the new computer at precisely the point where the user stopped interacting with the first computer. To perform such an activity a "smart card" may be used. A smart card is a card-like device that is physically inserted into the computer and read by the computer. The smart card provides information to the new computer that enables it, for example, to locate the data and computer programs necessary to re-create the computing session that was terminated on the old computer.

Typically many computing devices using smart cards are connected to a few servers that store the data and execute the computer programs. When a user inserts the smart card a message is sent to the server informing it that a card has been inserted. Upon receipt of the message the server responds by running a computer program that allows it to communicate with the card to identify what type of card it is and what data and computer programs are associated with the card.

In the past, servers have failed to perform properly when too many end-users were inserting smart cards into their computing devices at the same time. There is currently no effective way to determine what situations might cause a server to perform improperly. Before discussing the drawbacks associated with current schemes, it is instructive to discuss how the nature of computing is changing.

The Nature of Computing

The nature of computing is changing. Originally, computing was "machine-centric" where users accessed a dedicated computer at a single location. The dedicated computer had all the data and computer programs necessary for the user to operate the computer and it ideally had large amounts of hardware, such as disk drives, memory, processors, and the like. With the advent of the Internet, however, different computers have become more desirable and the focus of computing -has become "service-oriented". In particular, the Internet allows a user to access data and computer programs that exist elsewhere by using a computer network When the user accesses such data or computer programs, the remote computer is said to be providing a service to the user. With the improvement in services available to users, the need to have a dedicated computer following the machine-centric paradigm is greatly reduced.

In particular, computers in a service-oriented environment have little need for robust hardware. For instance, the remote computer processes the instructions before providing the service, so a powerful processor is not needed. Similarly, the service is providing the data so there is little need to have large capacity disk drives. In such an environment, one advantage is that a user can access any computer at any location and still use the computer in the same manner (i.e., have access to the same data and computer programs). For instance, a user may be in location A and running a word processor and a game. In a service-oriented environment, the user could stop using the computer in location A and move to location B where the user could resume word processing and game playing on the different machine at the exact point where the user stopped using the machine at location A An architecture that makes such an interaction possible is described below.

Multi-Tier Application Architecture

In the multi-tier application architecture, a client communicates requests to a server for data, software and services, for example, and the server responds to the requests. The server's response may entail communication with a database management system for the storage and retrieval of data.

The multi-tier architecture includes at least a database tier that includes a database server, an application tier that includes an application server and application logic (i.e., software application programs, functions, etc.), and a client tier. The application server responds to application requests received from the client and forwards data requests to the database server.

Figure 1:
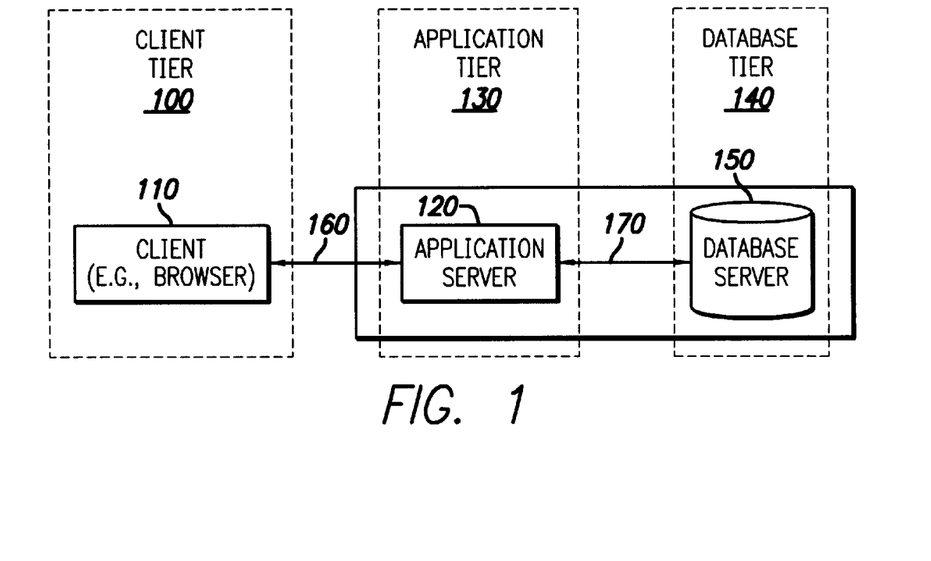
FIG. 1 provides an overview of a multi-tier computer architecture.

FIG. 1 provides an overview of a multi-tier architecture. Client tier 100 typically consists of a computer system that provides a graphic user interface (GUI) generated by a client 110, such as a browser or other user interface application. Conventional browsers include Internet Explorer and Netscape Navigator, among others. Client 110 generates a display from, for example, a specification of GUI elements (e.g., a file containing input, form, and text elements defined using the Hypertext Markup Language (HTML)) and/or from an applet (i.e., a program such as a program written using the Java™ programming language, or other platform independent programming language, that runs when it is loaded by the browser).

Further application functionality is provided by application logic managed by application server 120 in application tier 130. The apportionment of application functionality between client tier 100 and application tier 130 is dependent upon whether a "thin client" or "thick client" topology is desired. In a thin client topology, the client tier (i.e., the end user's computer) is used primarily to display output and obtain input, while the computing takes place in other tiers. A thick client topology, on the other hand, uses a more conventional general purpose computer having processing, memory, and data storage abilities. Database tier 140 contains the data that is accessed by the application logic in application tier 130. Database server 150 manages the data, its structure and the operations that can be performed on the data and/or its structure.

Application server 120 can include applications such as a corporation's scheduling, accounting, personnel and payroll applications, for example. Application server 120 manages requests for the applications that are stored therein. Application server 120 can also manage the storage and dissemination of production versions of application logic. Database server 150 manages the database(s) that manage data for applications. Database server 150 responds to requests to access the scheduling, accounting, personnel and payroll applications' data, for example.

Connection 160 is used to transmit data between client tier 100 and application tier 130, and may also be used to transfer the application logic to client tier 100. The client tier can communicate with the application tier via, for example, a Remote Method Invocator (RMI) application programming interface (API) available from Sun Microsystems™. The RMI API provides the ability to invoke methods, or software modules, that reside on another computer system. Parameters are packaged and unpackaged for transmittal to and from the client tier. Connection 170 between application server 120 and database server 150 represents the transmission of requests for data and the responses to such requests from applications that reside in application server 120.

Elements of the client tier, application tier and database tier (e.g., client 110 application server 120 and database server 150) may execute within a single computer. However, in a typical system, elements of the client tier, application tier and database tier may execute within separate computers interconnected over a network such as a LAN (local area network) or WAN (wide area network).

Thus, with the distribution of functionality between three or more tiers, the machine-centric view of computing diminishes as the need to perform the complete realm of functionality moves away from solely being in the client tier to the other tiers as well. Hence, the type of computing arrangement that is needed on the client tier also changes.

Smart Cards

Since modem computing moves the processing of data and computer programs away from the client, it allows the client the freedom to move between computing devices and continue to have access to the same data and computer programs. Smart cards are one way to tell a computer outside the client tier who the user is, what they were doing before they removed their smart card, and what actions the new computer should take to re-create the computing session.

Problems occur, however, when too many users simultaneously insert smart cards into computing devices. In addition, some users will wiggle their smart cards which causes the server to receive multiple messages instructing it that the smart card has been inserted and removed over and over. In these situations the server becomes overloaded with messages and fails to operate as expected. Thus, it is desirable to know how many simultaneous insertions and removals of smart cards the server can handle so that the operating limits of such a computing arrangement can be verified.

Testing Smart Cards

Traditionally, there are two ways to test the operating limits of this computing arrangement. A first method is to have a person at each computing device manually insert and remove their smart card simultaneously. Then, the behavior of the system can be manually monitored as these actions occur. This method has drawbacks first because it is expensive to have many people present to perform the insertions and removals. Secondly, this method is disadvantageous because since people are manually performing the insertions and removals, there is an upper limit to how fast each step of the process takes place.

A second method of testing the operating limits of a computing arrangement that uses smart cards is to modify both the device which receives the smart card and the software or hardware in the computing system that enables the use of the smart card. This modification includes the addition of additional instructions to the computer that simulate smart card insertions and removals. This method is disadvantageous because modifications to the system are required. This introduces behavior that might not normally occur in an un-modified system

SUMMARY OF THE INVENTION

The present invention is for non-invasive testing of smart cards. The invention comprises a central controller unit connected to a host computer. The controller unit is connected to one or more computing devices via a switch. In one embodiment, the switch is a cross-point matrix switch where many computing devices are coupled to the controller unit via the switch. The controller unit communicates with the host computer and accepts commands from the host computer so that the host computer can configure the controller unit to perform a testing scenario. One testing scenario tests the operating limit of a server where smart cards are simultaneously being inserted and removed from multiple testing devices connected to the server.

The switch connects to one or more testing devices, which includes one or more probes and one or more card terminals. The probes are devices, for instance boards, that plug into card terminals. Each probe has a motor that is coupled to a cylindrical tube. The motor-tube configuration is used to actuate a card detect sensor in the unit that receives the inserted smart card (card terminal). In operation, the motor-tube configuration is used to simulate repeated insertions and removals of smart cards without the physical removal of the probe that is simulating the smart card.

In one embodiment, the testing device includes a card terminal used for programming smart cards. In another embodiment, the testing device includes one or more smart card sockets. Each computing device may connect, via the switch, to any of the units configured to receive the smart cards, including the card terminal used for programming smart cards. Using the switch, the controller can cause one of the computing devices (or none) to be connected to one of the smart card terminals under test, and by using the motor and actuating the tube on the board, a card insertion and removal is simulated.

The host computer interfaced to the controller is used to generate and download commands to the controller and to receive status reports from the controller and the systems under test to verify the success of each test.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

The invention is for the non-invasive testing of smart cards. In the following description, numerous specific details are set forth to provide a more thorough description of embodiments of the invention. It will be apparent, however, to one skilled in the art, that the invention maybe practiced without these specific details. In other instances, well known features have not been described in detail so as not to obscure the invention.

Non-Invasive Testing System

Figure 6:
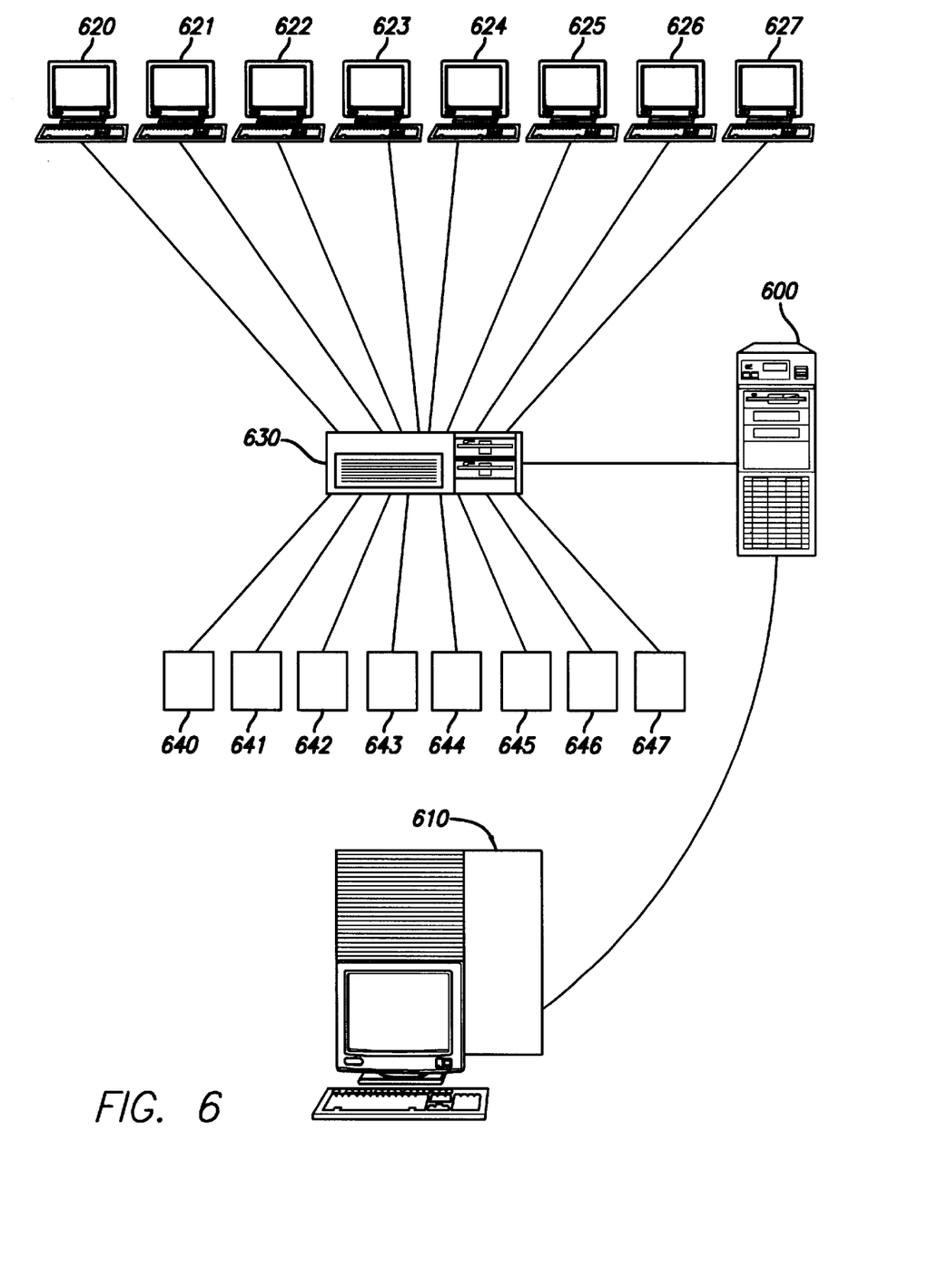
FIG. 6 is a block diagram of a non-invasive testing system for smart cards according to an embodiment of the present invention.

FIG. 6 is a block diagram of a non-invasive testing system for smart cards according to one embodiment of the present invention. In FIG. 6 central controller unit 600 is connected to a host computer 610. The controller unit 600 is connected to one or more computing devices 620–627 via a switch 630. The controller unit communicates with the host computer and accepts commands from the host computer so that the host computer can configure the controller unit to perform a testing scenario. One testing scenario tests the operating limit of a server where smart cards are simultaneously being inserted and removed from multiple computing devices connected to the server.

The switch connects to one or more testing devices 640–647, which include one or more probes and one or more card terminals. The probes and card terminals are described in more detail in FIG. 12. The probe 1200 is a device that comprises a surface 1210, for instance a board, that plugs into the testing device 1220. where the smart card is inserted. Each probe 1200 has a motor 1230 that is coupled to a cylindrical tube 1240. The motor-tube configuration is used to actuate a card detect sensor 1250 in the card terminal 1260 of the testing device 1220. In operation, the motor-tube configuration is used to simulate repeated insertion and removal of smart cards without the physical removal of the probe.

Figure 12:
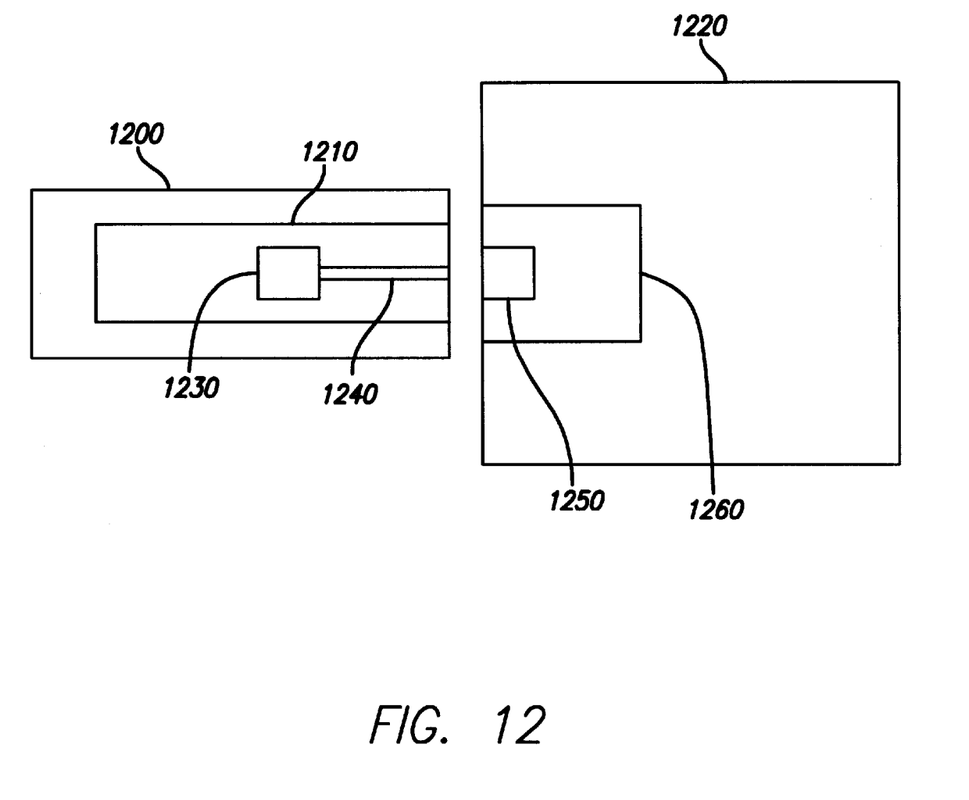
FIG. 12 is a block diagram of a probe according to an embodiment of the present invention

In one embodiment the testing device includes a card terminal used for programming smart cards. In another embodiment, the testing device includes one or more smart card sockets. Each computing device may connect, via the switch, to any of the units configured to receive the smart cards, including the card terminal used for programming smart cards. Using the switch, the controller can cause one of the computing devices (or none) to be connected to one of the smart card terminals under test, and by using the motor and actuating the tube on the board, a card insertion and removal is simulated.

The host computer interfaced to the controller is used to generate and download commands to the controller and to receive status reports from the controller and the systems under test to verify the success of each test.

Figure 7:
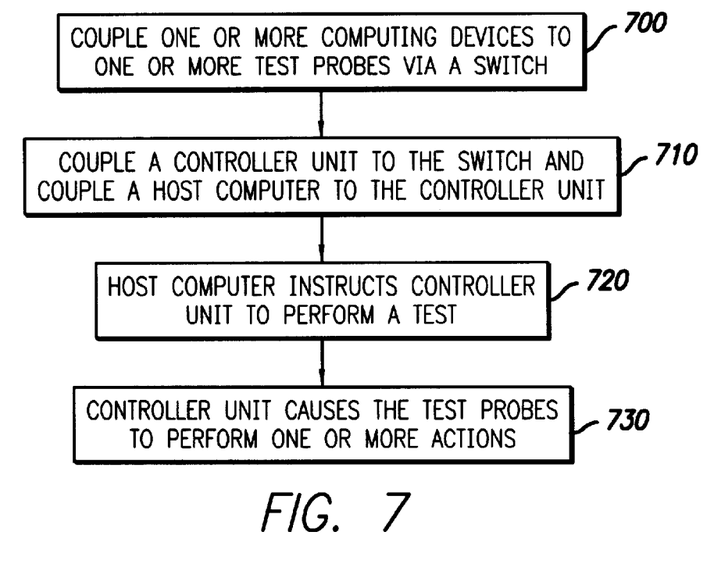
FIG. 7 is a flowchart showing a non-invasive testing system for smart cards according to an embodiment of the present invention.

FIG. 7 is a flowchart showing the operation of a non-invasive testing system according to an embodiment of the present invention. At step 700 one or more computing devices are coupled to one or more test probes via a switch. Then, at step 710, a controller unit is coupled to the switch and a host computer is coupled to the controller unit. Next, at step 720 the host computer instructs the controller unit how to perform a test. Thereafter, at step 730 the controller unit follows the instructions of the host computer and causes the test probes to perform one or more actions.

Figure 8:
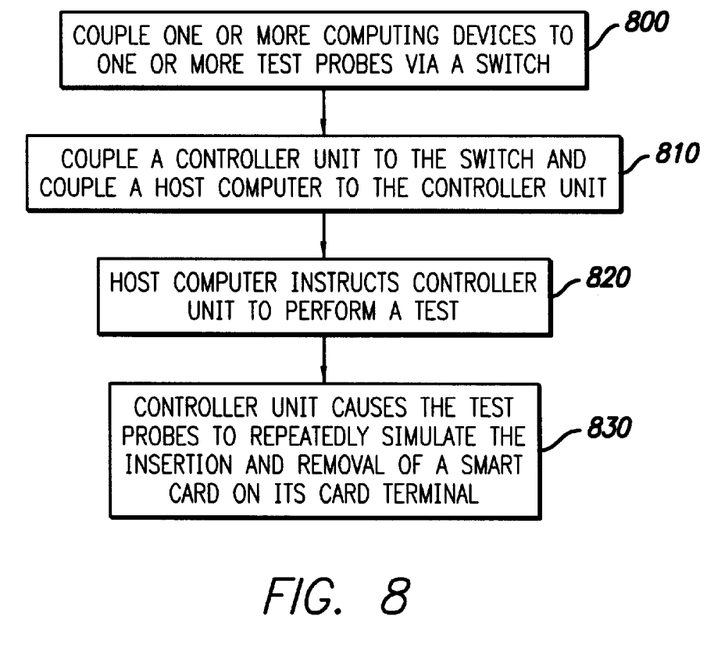
FIG. 8 is a flowchart showing a non-invasive testing system for smart cards according to another embodiment of the present invention.

Another embodiment of the present invention is shown in FIG. 8. At step 800 one or more computing devices are coupled to one or more test probes via a switch. Then, at step 810, a controller unit is coupled to the switch and a host computer is coupled to the controller unit. Next at step 820 the host computer instructs the controller unit how to perform a test. Thereafter, at step 830 the controller unit follows the instructions of the host computer and causes the test probes to repeatedly simulate the insertion and removal of a smart card on its respective card terminal.

Figure 9:
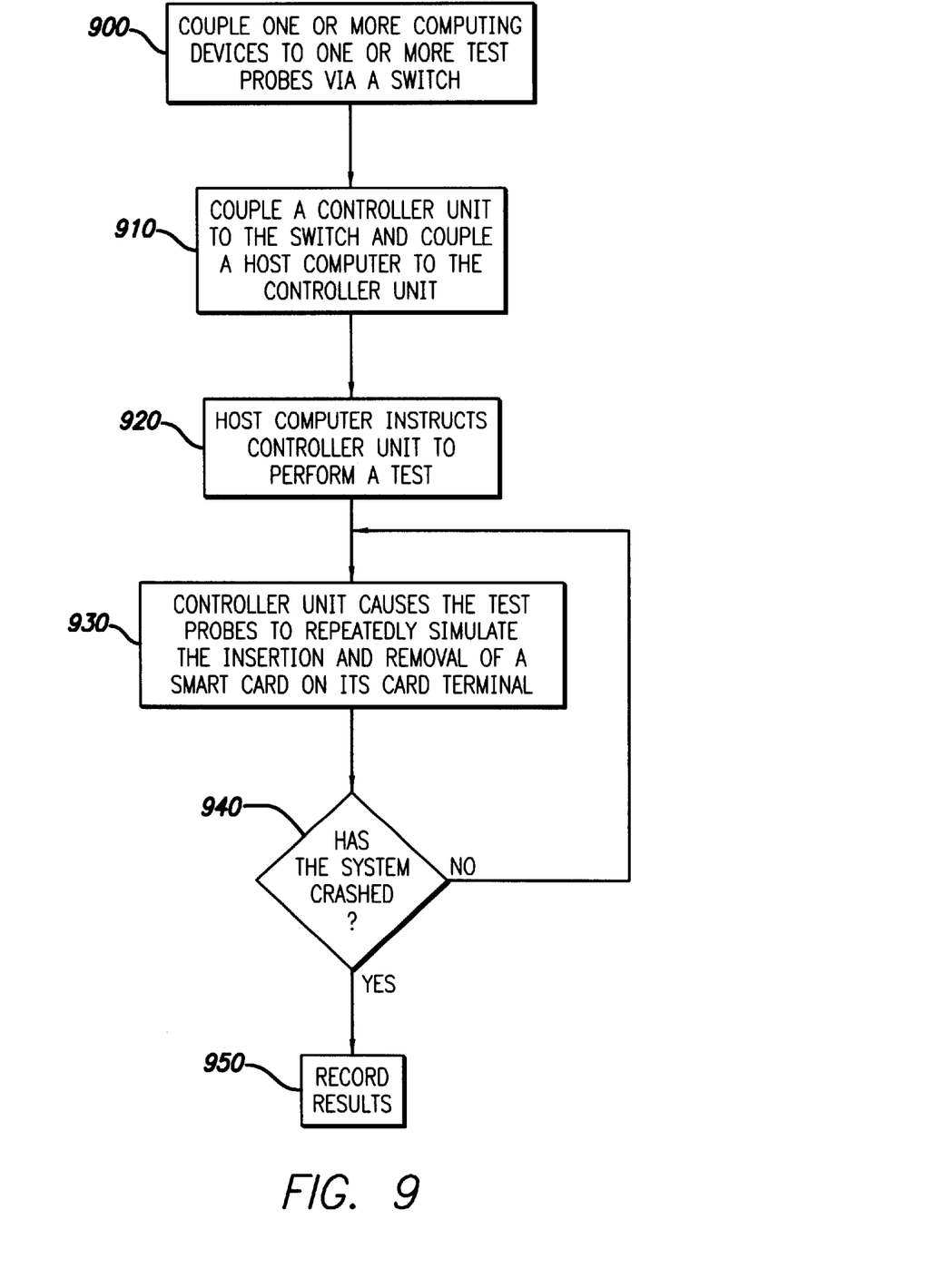
FIG. 9 is a flowchart showing a non-invasive testing system for smart cards according to yet another embodiment of the present invention.

Another embodiment of the present invention is shown in FIG. 9. At step 900 one or more computing devices are coupled to one or more test probes via a switch. Then, at step 910, a controller unit is coupled to the switch and a host computer is coupled to the controller unit. Next, at step 920 the host computer instructs the controller unit how to perform a test. Thereafter, at step 930 the controller unit follows the instructions of the host computer and causes the test probes to repeatedly simulate the insertion and removal of a smart card on its respective card terminals. Thereafter, at step 940, it is determined whether the system has crashed. If it has, the results are recorded at step 950. Otherwise, the process repeats at step 930.

Figure 11:
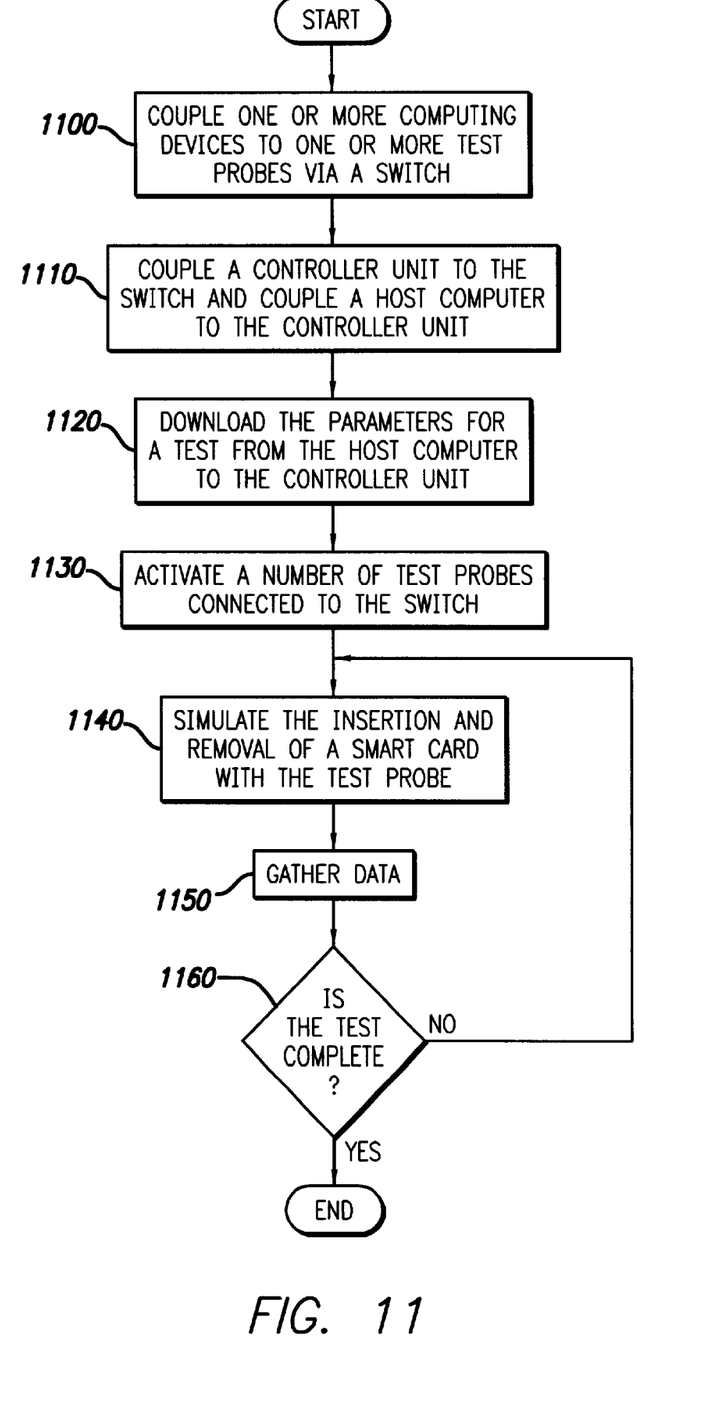
FIG. 11 is a flowchart showing a non-invasive testing system for smart cards according to yet another embodiment of the present invention.

Another embodiment of a non-invasive smart card testing system is shown in FIG. 11. At step 1100 one or more computing devices are coupled to one or more test probes via a switch. Then, at step 1110, a controller unit is coupled to the switch and a host computer is coupled to the controller unit. Next, at step 1120 the host computer downloads the parameters for a test to the controller unit. Then, at step 1130, the controller unit uses the parameters and activates a number of test probes connected to the switch. Thereafter at step 1140 the test probes simulate the insertion and removal of a smart card on its respective card terminal.

After the insertion and removal data is gathered at step 1150 including whether the system has crashed and what affect of the insertion and removal sequence has had on the server in this cycle. Then it is determined whether the test is complete at step 1160. If it is, the process is complete. Otherwise, the process repeats at step 1140 where another sequence of insertions and removals occurs.

Virtual Desktop System Architecture

Figure 2:
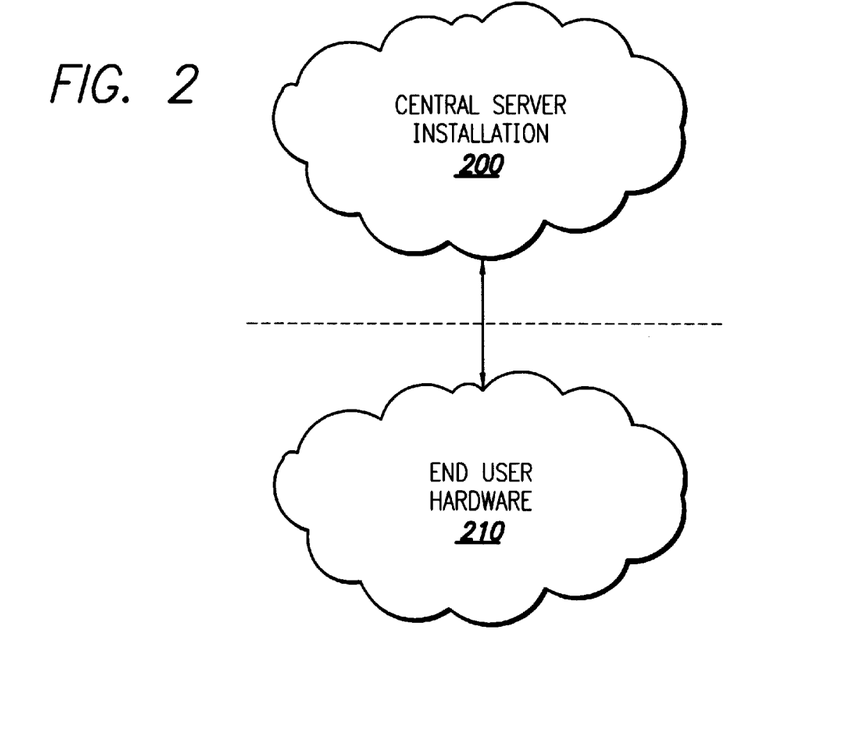
FIG. 2 shows an example of a thin client topology called a virtual desktop system architecture.

FIG. 2 shows an example of a thin client topology called a virtual desktop system architecture which provides one example of an environment suitable for use with the present invention. The virtual desktop system architecture provides a re-partitioning of functionality between a central server installation 200 and end user hardware 210. Data and computational functionality are provided by data sources via a centralized processing arrangement. At the user end, all functionality is eliminated except that which generates output to the user (e.g., display and speakers), takes input from the user (e.g., mouse and keyboard) or other peripherals that the user may interact with (e.g., scanners, cameras, removable storage, etc.). All computing is done by the central data source and the computing is done independently of the destination of the data being generated. The output of the source is provided to a terminal, referred to here as a "Human Interface Device" (HID). The HID is capable of receiving the data and displaying the data.

Figure 3:
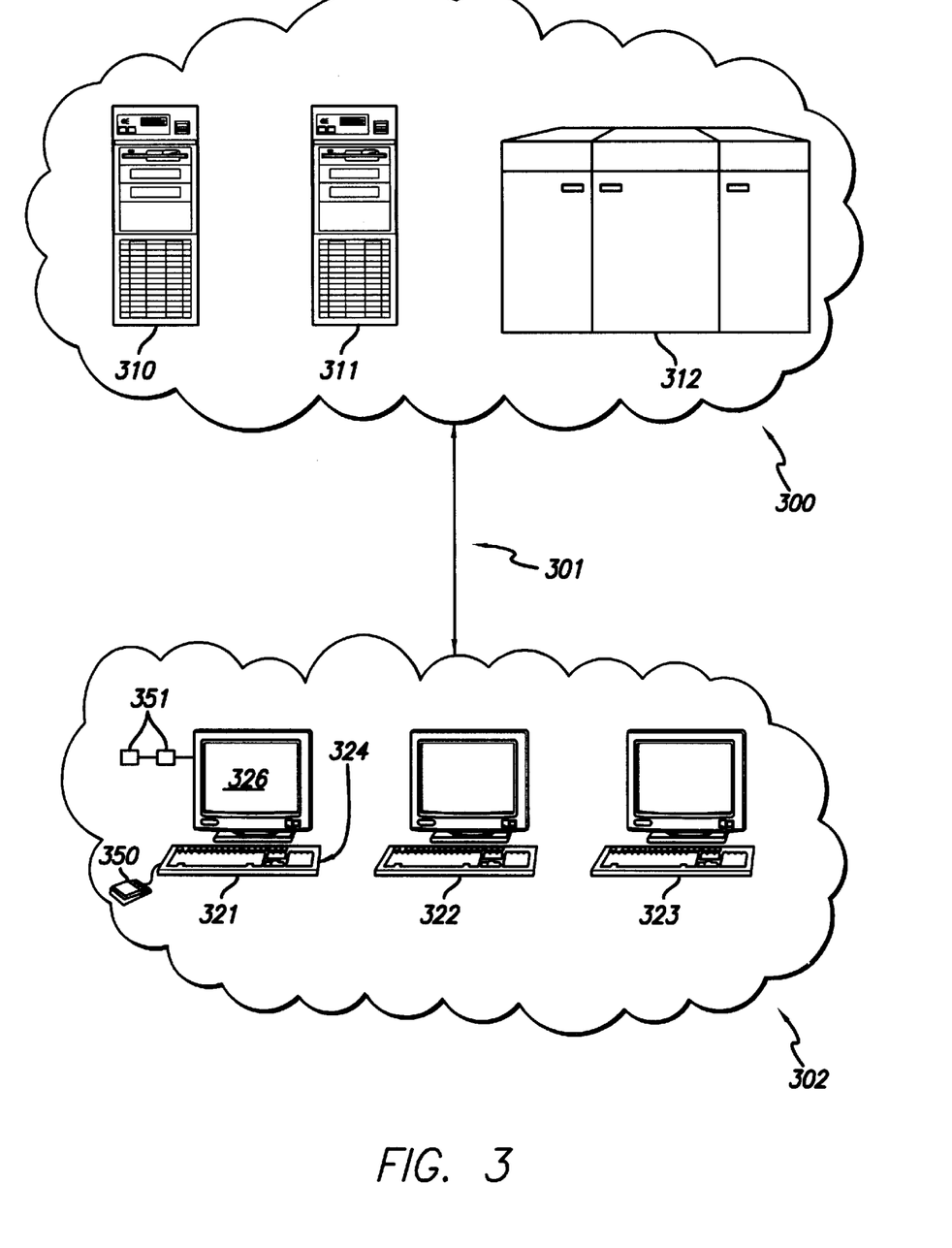
FIG. 3 displays the partitioning of the functionality of the virtual desktop system architecture.

The functionality of the virtual desktop system is partitioned between a display and input device such as a remote system and associated display device, and data sources or services such as a host system interconnected to the remote system via a communication link. The display and input device is a human interface device (HID). The system is partitioned such that state and computation functions have been removed from the HID and reside on data sources or services. One or more services communicate with one or more HIDs through a communication link such as network. An example of such a system is illustrated in FIG. 3, wherein the system comprises computational service providers 300 communicating data through communication link 301 to HIDs 302.

The computational power and state maintenance is provided by the service providers or services. The services are not tied to a specific computer, but may be distributed over one or more traditional desktop systems such as described in connection with FIG. 4, or with traditional servers. One computer may have one or more services, or a service may be implemented by one or more computers. The service provides computation, state and data to HIDs and the service is under the control of a common authority or manager. In FIG. 3, the services are provided by computers 310, 311, and 312. In addition to the services, a central data source can provide data to the HIDs from an external source such as for example the Internet or world wide web. The data source can also broadcast entities such as those that broadcast data such as television and radio signals.

Examples of services include X11/Unix services, archived or live audio or video services, Windows NT service, Java program execution service and others. A service herein is a process that provides output data and response to user requests and input. The service handles communication with an HID currently used by a user to access the service. This includes taking the output from the computational service and converting it to a standard protocol for the HID. The data protocol conversion is handled by a middleware layer, such as the X11 server, the Microsoft Windows interface, video format transcoder, the OpenGL interface, or a variant of the java.awt.graphics class within the service producer machine. The service machine handles the translation to and from a virtual desktop architecture wire protocol described further below.

Each service is provided by a computing device optimized for its performance. For example, an Enterprise class machine could be used to provide X11/Unix service, a Sun MediaCenter could be used to provider video service, a Hydra based NT machine could provide applet program execution services.

The service providing computer system can connect directly to the HIDs through the interconnect fabric. It is also possible for the service producer to be a proxy for another device providing the computational service, such as a database computer in a three-tier architecture, where the proxy computer might only generate queries and execute user interface code.

The interconnect fabric can comprise any of multiple suitable communication paths for carrying data between the services and the HIDs. In one embodiment the interconnect fabric is a local area network implemented as an Ethernet network. Any other local network may also be utilized. The invention also contemplates the use of wide area networks, the Internet, the world wide web, and others. The interconnect fabric may be implemented with a physical medium such as a wire or fiber optic cable, or it may be implemented in a wireless environment.

The interconnect fabric provides actively managed, low-latency, high-bandwidth communication between the HID and the services being accessed. One embodiment contemplates a single-level, switched network, with cooperative (as opposed to completing) network traffic. Dedicated or shared communications interconnects maybe used in the present invention. The HID is the means by which users access the computational services provided by the services. FIG. 3 illustrates HIDs 321, 322 and 323. Each HID comprises a display 326, a keyboard 324, mouse 350, and audio speakers 351. The HID includes the electronics need to interface these devices to the interconnection fabric and to transmit to and receive data from the services.

Figure 4:
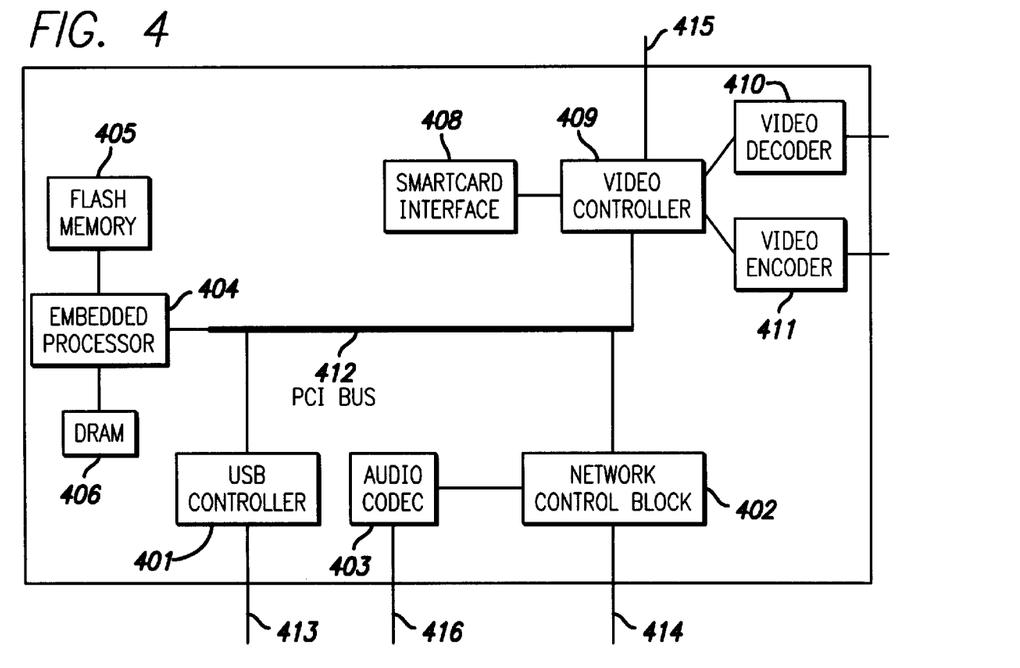
FIG. 4 is a block diagram of an example embodiment of a human interface device.

A block diagram of an example embodiment of the HID is illustrated in FIG. 4. The components of the HID are coupled internally to a PCI bus 412. A network control block 402 communicates to the interconnect fabric, such as an Ethernet, through line 414. An audio codec 403 receives audio data on interface 416 and is coupled to block 402. USB data communication is provided on lines 413 to a USB controller 401. The HID further comprises a embedded processor 404 such as a Sparc2ep with coupled flash memory 405 and DRAM 406. The USB controller 401, the network controller 402 and the embedded processor 404 are all coupled to the PCI bus 412. A video controller 409, also coupled to the PCI bus 412, can include an ATI RagePro+ frame buffer controller which provides SVGA output on the line 415. NTSC data is provided in and out of the video controller through video decoder 410 and encoder 411 respectively. A smartcard interface 408 may also be coupled to the video controller 409.

Figure 5:
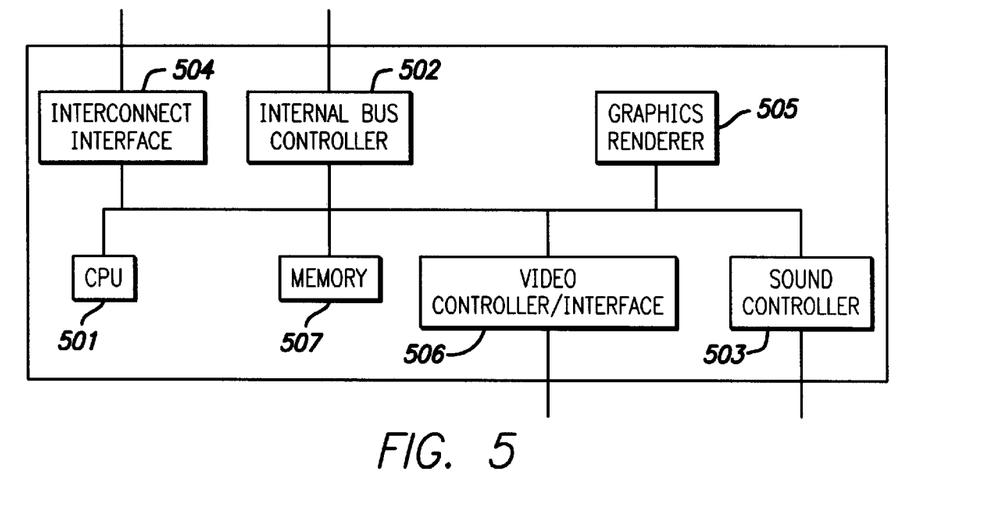
FIG. 5 is a block diagram of a single chip implementation of a human interface device.

Alternatively, the HID can comprise a single chip implementation as illustrated in FIG. 5. The single chip includes the necessary processing capability implemented via CPU 501 and graphics renderer 505. Chip memory 507 is provided, along with video controller/interface 506. A internal bus (USB) controller 502 is provided to permit communication to a mouse, keyboard and other local devices attached to the HID. A sound controller 503 and interconnect interface 504 are also provided. The video interface shares memory 507 with the CPU 501 and graphics renderer 505. The software used in this embodiment may reside locally in on-volatile memory or it can be loaded through the interconnection interface when the device is powered.

The operation of the virtual desktop system architecture is described in co-pending U.S. patent application Ser. No. 09/063,335, filed Apr. 20, 1998, entitled "Method and Apparatus for Providing a Virtual Desktop System Architecture" and assigned to the present assignee, and incorporated herein by reference.

Computer Execution Environment

Figure 10:
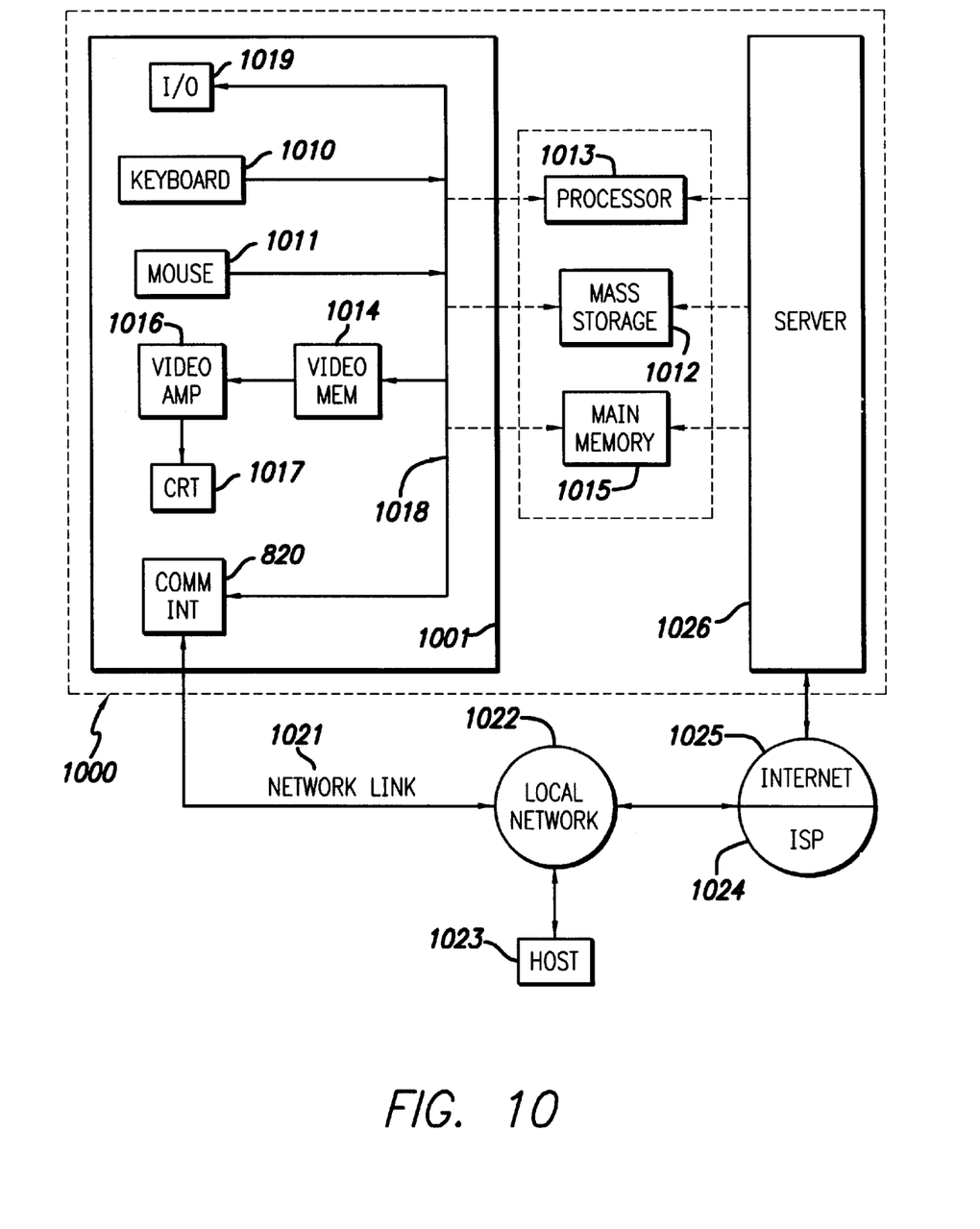
FIG. 10 is an embodiment of a computer execution environment suitable for the present invention.

An embodiment of the invention can be implemented as computer software in the form of computer readable program code executed in a general purpose computing environment such as environment 1000 illustrated in FIG. 10, or in the form of bytecode class files executable within a Java™ run time environment running in such an environment, or in the form of bytecodes running on a processor (or devices enabled to process bytecodes) existing in a distributed environment (e.g., one or more processors on a network). A keyboard 1010 and mouse 1011 are coupled to a system bus 1018. The keyboard and mouse are for introducing user input to the computer system and communicating that user input to central processing unit (CPU) 1013. Other suitable input devices may be used in addition to, or in place of, the mouse 1011 and keyboard 1010. I/O (input/output) unit 1019 coupled to bi-directional system bus 1018 represents such I/O elements as a printer, A/V (audio/video) I/O, etc.

Computer 1001 may include a communication interface 1020 coupled to bus 1018. Communication interface 1020 provides a two-way data communication coupling via a network link 1021 to a local network 1022. For example, if communication interface 1020 is an integrated services digital network (ISDN) card or a modem, communication interface 1020 provides a data communication connection to the corresponding type of telephone line, which comprises part of network link 1021. If communication interface 1020 is a local area network (LAN) card, communication interface 1020 provides a data communication connection via network link 1021 to a compatible LAN. Wireless links are also possible. In any such implementation, communication interface 1020 sends and receives electrical, electromagnetic or optical signals which carry digital data streams representing various types of information.

Network link 1021 typically provides data communication through one or more networks to other data devices. For example, network link 1021 may provide a connection through local network 1022 to local server computer 1023 or to data equipment operated by ISP 1024. ISP 1024 in turn provides data communication services through a world wide packet data communication network, such as the Internet 1025. Local network 1022 and Internet 1025 both use electrical, electromagnetic or optical signals which carry digital data streams. The signals through the various networks and the signals on network link 1021 and through communication interface 1020, which carry the digital data to and from computer 1000, are exemplary forms of carrier waves transporting the information.

Processor 1013 may reside wholly on client computer 1001 or wholly on server 1026 or processor 1013 may have its computational power distributed between computer 1001 and server 1026. Server 1026 symbolically is represented in FIG. 10 as one unit, but server 1026 can also be distributed between multiple "tiers". In one embodiment, server 1026 comprises a middle and back tier where application logic executes in the middle tier and persistent data is obtained in the back tier. In the case where processor 1013 resides wholly on server 1026, the results of the computations performed by processor 1013 are transmitted to computer 1001 via Internet 1025, Internet Service Provider (ISP) 1024, local network 1022 and communication interface 1020. In this way, computer 1001 is able to display the results of the computation to a user in the form of output.

Computer 1001 includes a video memory 1014, main memory 1015 and mass storage 1012, all coupled to bi-directional system bus 1018 along with keyboard 1010, mouse 1011 and processor 1013. As with processor 1013, in various computing environments, main memory 1015 and mass storage 1012, can reside wholly on server 1026 or computer 1001, or they may be distributed between the two. Examples of systems where processor 1013, main memory 1015, and mass storage 1012 are distributed between computer 1001 and server 1026 include the thin-client computing architecture, in architectures where PDAs are used, in Internet enabled cellular phones and other Internet computing devices, and in platform independent computing environments, such as those which utilize the Java technologies.

The mass storage 1012 may include both fixed and removable media, such as magnetic, optical or magnetic optical storage systems or any other available mass storage technology. Bus 1018 may contain, for example, thirty-two address lines for addressing video memory 1014 or main memory 1015. The system bus 1018 also includes, for example, a 32-bit data bus for transferring data between and among the components, such as processor 1013, main memory 1015, video memory 1014 and mass storage 1012. Alternatively, multiplex data/address lines may be used instead of separate data and address lines.

In one embodiment of the invention, the processor 1013 is a microprocessor manufactured by Motorola, such as the 680X0 processor or a microprocessor manufactured by Intel, such as the 80X86, or Pentium processor, or a SPARC microprocessor from Sun Microsystems, Inc. However, any other suitable microprocessor or microcomputer may be utilized. Main memory 1015 is comprised of dynamic random access memory (DRAM). Video memory 1014 is a dual-ported video random access memory. One port of the video memory 1014 is coupled to video amplifier 1016. The video amplifier 1016 is used to drive the cathode ray tube (CRT) raster monitor 1017. Video amplifier 1016 is well known in the art and maybe implemented by any suitable apparatus. This circuitry converts pixel data stored in video memory 1014 to a raster signal suitable for use by monitor 1017. Monitor 1017 is a type of monitor suitable for displaying graphic images.

Computer 1001 can send messages and receive data, including program code, through the network(s), network link 1021, and communication interface 1020. In the Internet example, remote server computer 1026 might transmit a requested code for an application program through Internet 1025, ISP 1024, local network 1022 and communication interface 1020. The received code may be executed by processor 1013 as it is received, and/or stored in mass storage 1012, or other non-volatile storage for later execution. In this manner, computer 1000 may obtain application code in the form of a carrier wave. Alternatively, remote server computer 1026 may execute applications using processor 1013, and utilize mass storage 1012, and/or video memory 1015. The results of the execution at server 1026 are then transmitted through Internet 1025, ISP 1024, local network 1022 and communication interface 1020. In this example, computer 1001 performs only input and output functions.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves.

The computer systems described above are for purposes of example only. An embodiment of the invention may be implemented in any type of computer system or programming or processing environment.

Thus, non-invasive testing of smart cards is described in conjunction with one or more specific embodiments. The invention is defined by the claims and their full scope of equivalents.

What is claimed is:

1. A non-invasive testing system comprising:
   a controller adapted to initiate one or more actions, said one or more actions simulating one or more smart cards interfacing with at least one card terminal;
   one or more computing devices coupled to said controller via a switch;
   one or more card terminals coupled to said controller and said one or more computing devices via said switch;
   one or more mechanical probes coupled to said one or more card terminals, said one or more mechanical probes being adapted to perform said one or more actions; and a host system coupled to said controller wherein said host system is adapted to transmit action data to said controller, said controller initiating said one or more actions in response to receiving said action data.

2. The system of claim 1 wherein said one or more actions comprise one or more insertions of a smart card.

3. The system of claim 1 wherein said one or more actions comprise one or more removals of a smart card.

4. The system of claim 1 wherein said one or more mechanical probes further includes a motor and a tube.

5. A method of non-invasive testing comprising:

coupling one or more computing devices to a controller via a switch;

coupling one or more card terminals to said one or more computing devices and said controller via said switch;

coupling one or more mechanical probes to said one or more card terminals;

performing one or more actions simulating at least one smart card interfacing with at least one card terminal; and coupling a host system to said controller wherein said host system causes said controller to initiate said one or more actions.

6. The method of claim 5 wherein said one or more actions comprise one or more insertions of a smart card.

7. The method of claim 5 wherein said one or more actions comprise one or more removals of a smart card.

8. The method of claim 5 wherein said one or more computing devices are human interface devices.

9. A computer program product comprising:

a computer usable medium having computer readable program code embodied therein configured to perform a non-invasive test, said computer program product comprising:

computer readable code configured to cause a computer to couple one or more computing devices to a controller via a switch;

computer readable code configured to cause a computer to couple one or more card terminals to said one or more computing device and said controller via said switch;

computer readable code configured to cause a computer to couple one or more mechanical probes to said one or more card terminals, said one or more mechanical probes being adapted to perform one or more actions simulating one or more smart cards interfacing with said one or more card terminals; and compute readable code configured to cause a computer to couple a host system to said controller wherein said host system causes said controller to initiate said one or more actions.

10. The computer program product of claim 9 wherein said one or more actions comprise one or more insertions of a smart card.

11. The computer program product of claim 9 wherein said one or more actions comprise one or more removals of a smart card.

12. The system of claim 1, wherein the performance of said one or more actions results in status data being transmitted to said host system.

13. The system of claim 1, further comprising one or more testing devices coupled to said one or more computing devices and said controller via said switch, said one or more testing devices including said one or more card terminals and one or more mechanical probes.

14. A method for non-invasive testing comprising:

transmitting initiation data to at least one mechanical probe, said initiation data related to a test;

said at least one mechanical probe performing at least one action in response to said initiation data, said at least one action simulating at least one smart card interfacing with at least one card terminal;

transmitting interface data related to said at least one action.

15. The method of claim 14, wherein said at least one action further comprises simulating at least one smart card being inserted into, and removed from, at least one card terminal.

16. The method of claim 14, further comprising:

transmitting status data to at least one controller.

17. The method of claim 14, further comprising:

transmitting status data to at least one host system.

18. The method of claim 14, further comprising:

transmitting command data, said initiation data being sent in response to receiving said command data.

19. The method of claim 15, wherein said at least one action is continued until said test is complete.

20. The method of claim 15, wherein said at least one action is continued until said test fails.

* * * * *

UNITED STATES PATENT AND TRADEMARK OFFICE
CERTIFICATE OF CORRECTION

PATENT NO. : 6,618,685 B1 Page 1 of 1
DATED : September 9, 2003
INVENTOR(S) : Michael S. Bender, Shivaputtrappa Vibhuti and Paul Klissner It is certified that error appears in the above-identified patent and that said Letters Patent is hereby corrected as shown below:

<u>Title page,</u>
Item [75], Inventors, the second inventor's name should read:
-- Shivaputrappa Vibhuti --

Signed and Sealed this

Twentieth Day of April, 2004

JON W. DUDAS
*Acting Director of the United States Patent and Trademark Office*